July 30, 1957 J. R. PIERCE 2,801,361

HIGH FREQUENCY AMPLIFIER

Filed Nov. 24, 1950 9 Sheets-Sheet 1

INVENTOR
J. R. PIERCE
BY N. S. Ewing
ATTORNEY

INVENTOR
J. R. PIERCE
BY N. D. Ewing
ATTORNEY

INVENTOR
J. R. PIERCE
BY N. S. Ewing
ATTORNEY

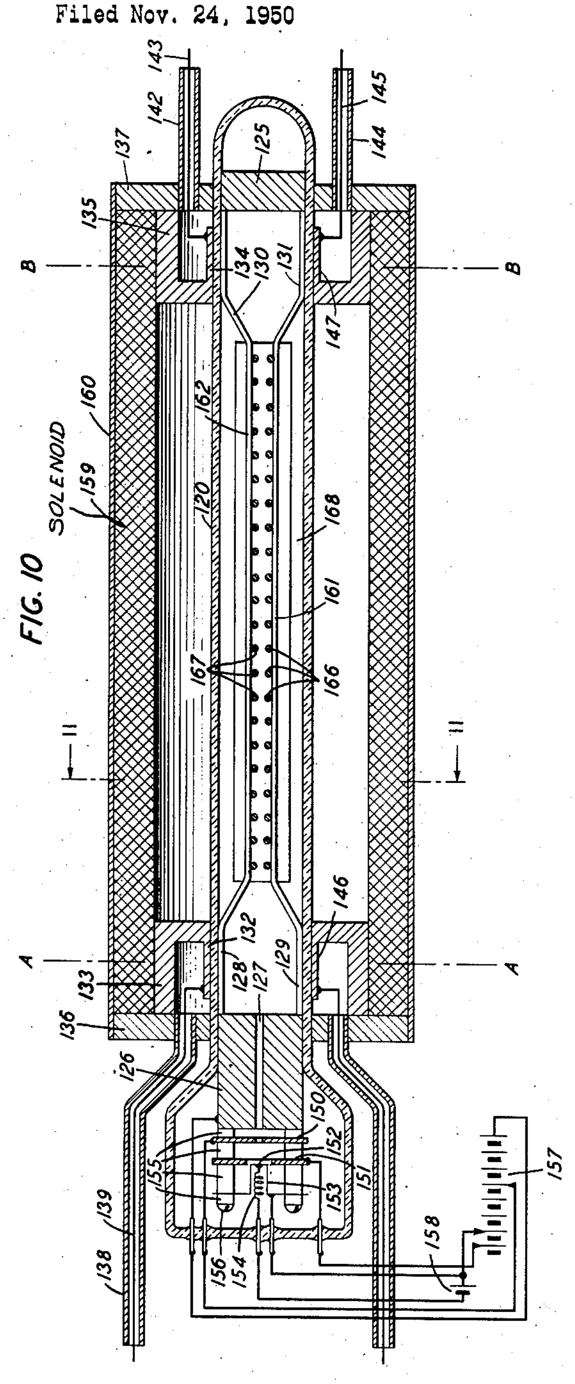
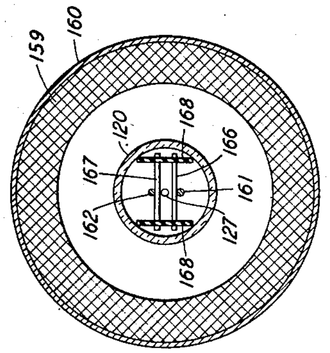
FIG. 11
INVENTOR
J. R. PIERCE
BY N. S. Ewing
ATTORNEY

INVENTOR
J. R. PIERCE
BY N. S. Ewing
ATTORNEY

INVENTOR
J. R. PIERCE
BY N. S. Ewing
ATTORNEY

HIGH FREQUENCY AMPLIFIER

Filed Nov. 24, 1950 9 Sheets-Sheet 7

INVENTOR
J. R. PIERCE
BY N. S. Ewing
ATTORNEY

INVENTOR
J. R. PIERCE
BY N. S. Ewing
ATTORNEY

INVENTOR
J. R. PIERCE
BY N. S. Ewing
ATTORNEY 2,801,361
Patented July 30, 1957

2,801,361

HIGH FREQUENCY AMPLIFIER

John R. Pierce, Berkeley Heights, N. J., assignor to Bell Telephone Laboratories, Incorporated, New York, N. Y., a corporation of New York Application November 24, 1950, Serial No. 197,412

24 Claims. (Cl. 315—3.6)

This invention relates to amplifier tubes of the traveling wave type. This is a type of high frequency amplifier tube incorporating a portion of electrical wave transmission path several wavelengths long, along which a beam of electrons is projected in the direction of wave propogation such that the beam may interact with the electric field of a high frequency wave transmitted along the path and produce amplification of the wave.

The invention relates particularly to such tubes in which the electrical wave circuit is adapted to produce an electric field transverse to the direction of wave propagation.

In part, this application is a continuation of my application Serial No. 64,669, filed December 10, 1948, and issued as Patent 2,707,759, May 3, 1955.

A principal object of the invention is to provide an amplifier tube of the traveling wave type having improved freedom from noise in the output.

Another object is to provide traveling wave tube structures well adapted to the effective use of the interaction between an electron beam and an electric field directed transversely thereto.

A subsidiary object is to provide in a transverse field type of traveling wave tube means for eliminating from the electron beam before it enters the transverse electric field electrons having substantial transverse velocities.

As is well know, in most traveling wave tubes even in the absence of a signal there is generated a noise output. This noise output is a result of the interaction of the individual electrons with the circuit and with the electron flow as a whole.

For the purpose of calculating gain the electron beam of a traveling wave tube can be regarded as a smooth distribution of charge. However, in considering the generation of noise, the discrete nature of the electron flow must be taken into account. In an ordinary traveling wave tube, for instance, a single electron entering the circuit acts as a little pulse of input signal and will produce a pulse of high frequency output power, and many electrons entering the circuit produce many pulses which add up to a noise output, and this noise output tends to obscure weak signals.

By the means herein disclosed, such noise output can be substantially reduced. It can be shown, for instance, that an electron in passing through the circuit of a traveling wave tube will induce a signal in the circuit only if a signal in the circuit produces a field which acts in the direction of the electron flow. This must be so because of the law of conservation of energy. If a signal is not able to add or to subtract from the kinetic energy of an electron, then the electron cannot lose kinetic energy and so induce a signal in the circuit. In ordinary traveling wave tubes, the electrons move substantially in the direction of the electric field produced by the signal in the circuit and hence they induce signals in the circuit.

Noise reduction is accomplished according to this invention by the use of a circuit which produces in the region of the electron flow an electric field substantially transverse to the direction of electron flow, a field with substantially no longitudinal, or axial, component. This in itself is not enough to insure low noise, for in an ordinary electron beam the electrons have, because of their thermal velocity on leaving the cathode, a substantial transverse component of velocity. A feature of the invention directed toward reducing the noise due to these electrons having velocity components in the direction of the transverse field is the provision of a collimating or aperturing system by means of which a substantial fraction of the electron beam produced by the electron gun is removed before it enters the circuit region of the traveling wave tube, and this substantial fraction of the electron beam includes those electrons which have appreciable transverse velocities due to thermal velocity of emission or to other causes. In order to be able to utilize a large number of electrons novel forms of guns are employed to provide dense beams of properly directed electrons.

The invention is explained more fully in the following description and the accompanying drawings of which:

Fig. 10 shows a tube employing as a wave circuit a two-wire line loaded with short transverse wires;

Fig. 11 shows a transverse section of the tube of Fig. 10;

Figures 1, 2, 3, 5:
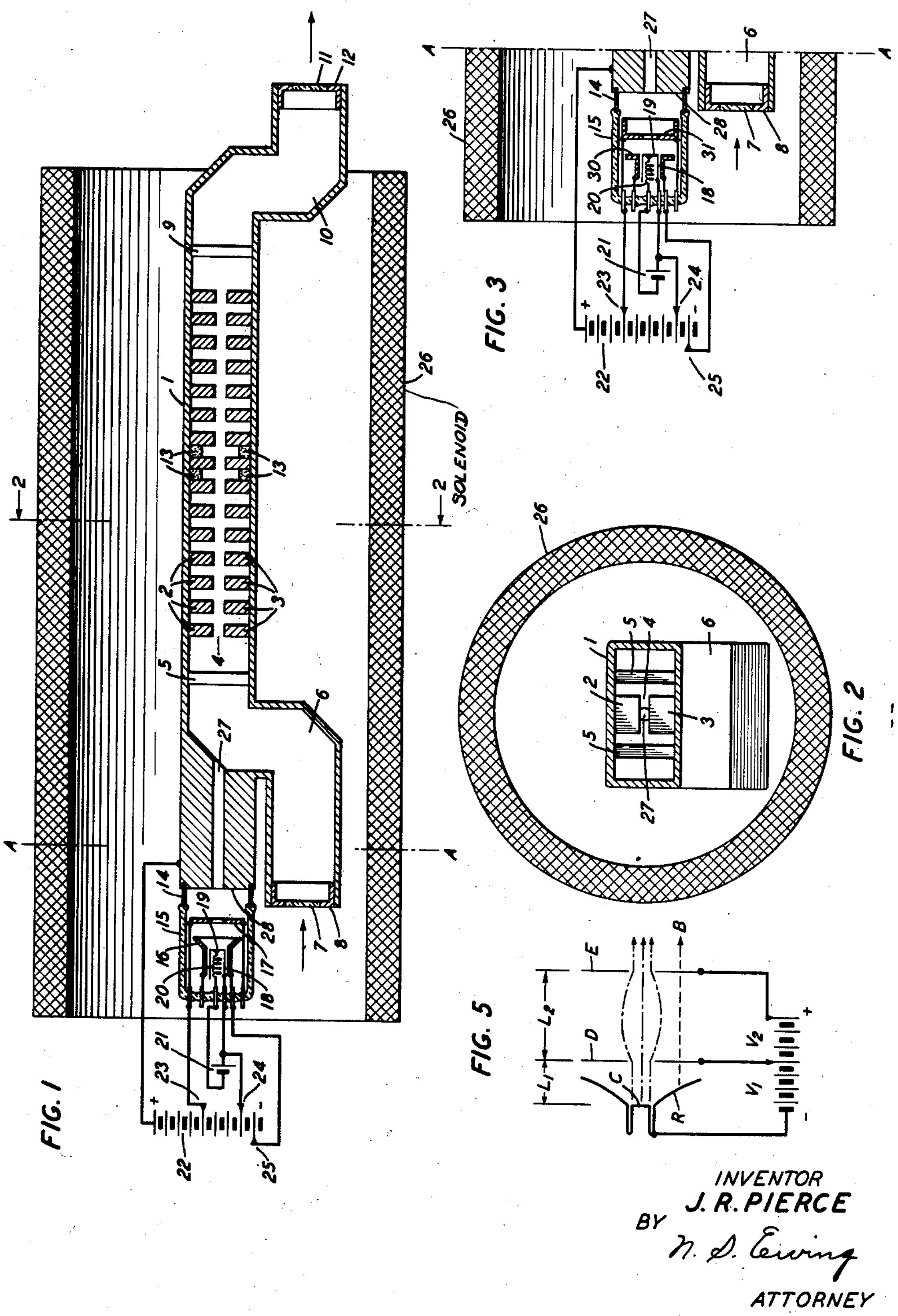
Fig. 1 is a longitudinal sectional view of a traveling wave tube illustrative of the invention and employing a wave guide type of circuit.
Fig. 2 is a transverse sectional view of the tube of Fig. 1.
Fig. 3 shows an alternative form of construction of the electron gun of Fig. 1.
Fig. 5 is a diagram employed in describing the theory of and the method of designing the electron gun of Fig. 1.

In Figs. 1 and 2, 1 is an evacuated metallic envelope which over a substantial portion of its interior forms a wave guide. An input signal enters the wave guide through vacuum-tight window 7 which is secured by a flange 8 to input wave guide 6. Metallic stubs or posts 2 and 3 projecting from the top and bottom walls of the wave guide form a filter-type circuit or corrugated wave guide which is capable of propagating slow electromagnetic waves having a transverse fiield along a central plane of symmetry, in the region designated 4. Inductive posts 5 of metal and connecting the top and bottom walls of the wave guide, are placed so as to match the impedance of the slow wave structure to the impedance of the input wave guide 6 over the operating range of frequency. Inductive posts 9, similar to posts 5 are placed to match the impedance of the corrugated, slow wave, structure to the impedance of the output wave guide 10. An output signal can travel out through ceramic or glass window 11 which is sealed in a vacuum-tight manner to output wave guide 10 by flange 12.

In the absence of electron flow a signal entering window 7 would proceed without reflection into the corrugated structure formed by posts 2 and 3 and emerge without reflection and be transmitted out through wave guide 10. In order to provide an attenuation to waves traveling in the reverse, backward, direction sufficient for stable operation of the tube as an amplifier, lossy material, as for instance lossy ceramic 13, may be placed in the grooves between some of the posts 2 and 3 of the corrugated structure.

From the emissive surface 19 of cathode 18 which is heated by heater 20 and battery 21, an electron stream is drawn. This electron stream is focused by electrodes 16, 17, and 28 onto a long narrow aperture 27. The narrow dimension of this aperture 27 is in the direction of the electric field of the wave propagated along the corrugated structure formed by posts 2 and 3 in the wave guide. Because the aperture 27 is very narrow in the direction of the electric filed, electrons with substantial components of velocity in the direction of the electric field strike the walls of the aperture and are removed from the beam which emerges from the aperture, passes through the electric field in space 4, and is finally collected on the wall of the output wave guide 10. As the electrons removed from the beam are those which have velocities in the direction of the field and could induce noise in the circuit, their removal results in quiet operation of the tube.

In order to accelerate the electrons from the cathode and to give them a velocity near to the velocity of the slow wave propagated in the corrugated structure, as is required in order to accomplish amplification of the wave, the metal envelope 1 and the whole circuit structure are held positive with respect to the cathode by battery 22. The focusing electrodes 16 and 17 are connected to taps 23 and 25 on battery 22, and their potentials are adjusted for the best operation. The cathode 18 is likewise connected to a tap 24 suitably adjusted on battery 22. The cathode structure and electrodes 16 and 17 are supported by pins sealed through a glass member 15, and this is sealed in a vacuum-tight manner to a thin metal cylinder 14 which in turn is brazed to envelope 1. A solenoid 26 energized by means not shown is used to produce a longitudinal magnetic focusing field to confine the electrons to a narrow beam during their travel through the circuit along space 4 where the field of the circuit is substantially transverse.

Because it is desired to utilize an electron beam free of electrons with components of velocity in the direction of the electric field (transverse to the direction of the beam) and it is also desired to utilize as large a proportion as possible of the electrons emitted from the cathode, it is advantageous that the electron gun project substantially all of the emitted electrons along the beam in straight parallel paths. An electron gun with an electrode system such as that shown in Fig. 1 and with the plane of the cathode perpendicular to a uniform magnetic field may be designed to produce a parallel beam of cathode diameter. Fig. 5 is a diagram of such a gun which will be referred to in explaining the theory and method of design. It may be noted that the cathode surface C and the associated electrode R of Fig. 5 correspond to the surface 19 and electrode 16 of Fig. 1 and that the apertured electrodes D and E of Fig. 5 correspond to the electrodes 17 and 28 of Fig. 1.

Referring to Fig. 5, it is assumed that the cathode C and electrode R can be designed so that the electron motion is substantially rectilinear between the cathode and the apertured electrode D which is held at a potential positive with respect to the cathode. In this case, the potential V will vary with distance $x$ from the cathode as $$V=Ax^{4/3}$$
$$A=5{,}700J^{2/3} \qquad (1)$$

where J is the current density. The units may be taken as volts, amperes, meters.

The operation of the gun is assumed to be as follows: The aperture in electrode D acts as a diverging lens. Between electrodes D and E, the magnetic field B brings the beam back to the initial distance from the axis with a radial velocity equal and opposite to that at D. The aperture at E acts as a diverging lens giving a radial velocity change equal to that at D, and it thus removes the radial velocity of the electrons so that the electrons emerge from this second aperture and travel along lines of force with no radial velocity.

The focal length F of an aperture lens is $$F=\frac{4V}{V_2'-V_1'} \qquad (2)$$

where V is the potential of the aperture plate with respect to the cathode which supplies the electrons, $V_2'$ is the potential gradient on the far side of the lens, and $V_1'$ is that on the near side of the lens.

For the aperture in electrode D we have $$V_2'=\frac{V_2-V_1}{L_2}$$

where $V_2$ is the potential difference between electrode E and cathode C, $V_1$ is the potential difference between electrode D and cathode A, and $L_2$ is the distance between electrodes D and E.

From (1)

$$\frac{dV}{dx}=\frac{4}{3}\frac{V}{x}$$

whence $$V_1'=\frac{4}{3}\frac{V_1}{L_1}$$

where $L_1$ is the distance between electrode D and cathode C and the focal length $F_D$ of the first lens (the aperture in D) is $$F_D=\frac{4V_1}{\frac{(V_2-V_1)}{L_2}-\frac{4}{3}\frac{V_1}{L_1}}$$

The longitudinal velocity at the aperture in D, $v_x$, is $$v_x=\sqrt{2\frac{e}{m}V_1}$$

where $$e = 1.602 \times 10^{-19} \text{ coulomb}$$

and $$m = 9.11 \times 10^{-31} \text{ kilogram}$$

The radial velocity $v_r$ on emerging from the aperture will be $$v_r = -v_x \frac{r}{F_D}$$

where $r$ is the radius (distance from the axis)

$$v_r = \frac{-\sqrt{2\frac{e}{m}}}{4\sqrt{V_1}}\left(\frac{(V_2-V_1)}{L_2} - \frac{4}{3}\frac{V_1}{L}\right) r \quad (3)$$

For the second aperture, that in electrode E $$V_1' = \frac{V_2 - V_1}{L_2}$$

$$V_2' = 0$$

$$F_E = \frac{4V_2}{-\left(\frac{V_2-V_1}{L_2}\right)}$$

and the change in radial velocity, $\Delta v_r$, is $$\Delta v_r = -v_x \frac{r}{F_E}$$

where $r$ is the radius (distance from the axis)

$$\Delta v_r = +\frac{\sqrt{2\frac{e}{m}}}{4\sqrt{V_2}}\left(\frac{V_2-V_1}{L_2}\right) r$$

Now, for the proper functioning of the gun $$v_r = \Delta v_r$$

$$\frac{-1}{\sqrt{V_1}}\left(\frac{V_2-V_1}{L_2} - \frac{4}{3}\frac{V_1}{L_1}\right) = \frac{1}{\sqrt{V_2}}\left(\frac{V_2-V_1}{L_2}\right) \quad (4)$$

$$\frac{L_2}{L_1} = \frac{3}{4}\left(\sqrt{\frac{V_1}{V_2}} + 1\right)\left(\frac{V_2}{V_1} - 1\right)$$

Figure 27:
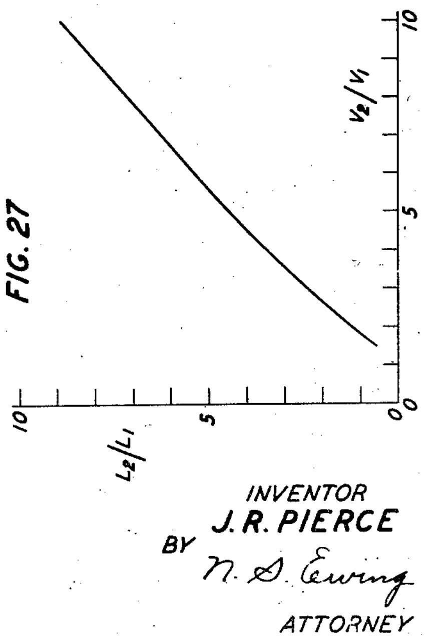
Fig. 27 is a graph used in connection with the description of Fig. 5.

In Fig. 27, $L_2/L_1$ is plotted against $V_2/V_1$.

If the effect of space charge fields between electrodes D and E is neglected, the magnetic field will return the electrons very nearly correctly if they execute an odd number of half cycles of oscillation in the magnetic field. The cyclotron period (period of electron oscillation in a magnetic field) T is $$T = \frac{2\pi}{\frac{e}{m}B}$$

where B is the magnetic field strength and MKS units are assumed.

The transit time $t$ between electrodes D and E is $$t = \frac{2L_2}{\sqrt{2\frac{e}{m}}(\sqrt{V_2} + \sqrt{V_1})} \quad (6)$$

Hence, in order that an odd number of oscillations be executed during transit between electrodes D and E, it is assumed, where $n$ is an integer $$\frac{2L_2}{\sqrt{2\frac{e}{m}}(\sqrt{V_2} + \sqrt{V_1})} = \frac{(2n+1)}{2}\frac{2\pi}{\frac{e}{m}B}$$

$$B = \frac{(2n+1)\pi\sqrt{V_1}\left(\sqrt{\frac{V_2}{V_1}} + 1\right)}{\sqrt{2}\sqrt{\frac{e}{m}}L_2} \quad (7)$$

In MKS units $$B = 5.28 \times 10^{-6}\frac{(2n+1)\sqrt{V_1}\left(\sqrt{\frac{V_2}{V_1}} + 1\right)}{L_2} \quad (8)$$

The field expressed in gauss is $10^4$ B.

Thus, in order to obtain a straight electron beam from a gun with two focusing apertures in a magnetic field such as is shown in Fig. 1, the spacings between the cathode and the apertures and the potential differences therebetween should be related, as expressed in Equation 4 above, and also the magnetic field strength between the apertures should be related to the potential differences between the apertures and the cathode and to the spacing between the apertures, as expressed in either of equivalent Equations 7 and 8 above. It may be noted that the spacings and potentials are measured from the cathode regardless of whether the member, such as R in Fig. 5 or 16 in Fig. 1, is connected directly to the cathode, as in Fig. 5, or to a point of different potential, as in Fig. 1.

With a straight electron beam so obtained, the cathode emission is efficiently used and high output of the device is had because a maximum number of the electrons emitted at the cathode leave the gun with velocities in the desired longitudinal direction only.

Figure 4:
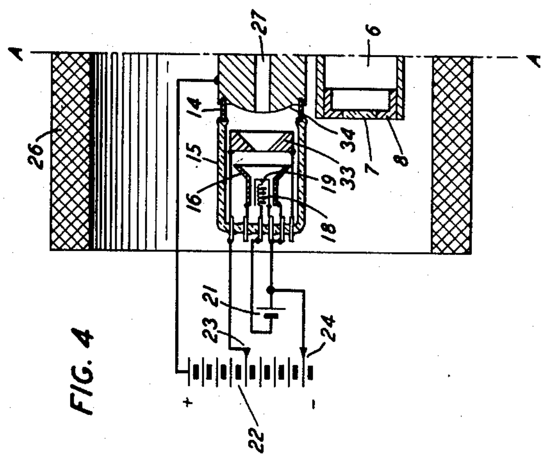
Fig. 4 shows another alternative form of construction of the electron gun of Fig. 1.

While the above calculations are restricted to the case where the potential variation between the two apertures is linear, it is also possible to use a potential variation other than linear, as a parabolic variation. In such cases, the calculation of the correct potential relations and magnetic field may be difficult, but certainly these can be arrived at experimentally. Figs. 3 and 4 illustrate some apertured electrode shapes which might be used. Fig. 3 shows a cupped electrode 31 in the place of the flat electrode 17 of Fig. 1, while Fig. 4 shows a conical electrode 33 and a curved surface 34 in the places of the flat electrode 17 and the flat surface 28 of Fig. 1. The structures of Figs. 3 and 4 may be substituted for the portion of Fig. 1 to the left of the broken line AA. All three electron guns shown in Figs. 1, 3, and 4 are adapted to produce a straight electron beam. However, the foregoing mathematical analysis applies strictly only to the gun of Fig. 1 with flat parallel electrodes.

It is quite obvious that all of these gun structures must be of non-magnetic material on account of the use made of the magnetic field and that all of the tube elements within the field of the solenoid 26 of Fig. 1 should be of non-magnetic material.

Figure 6:
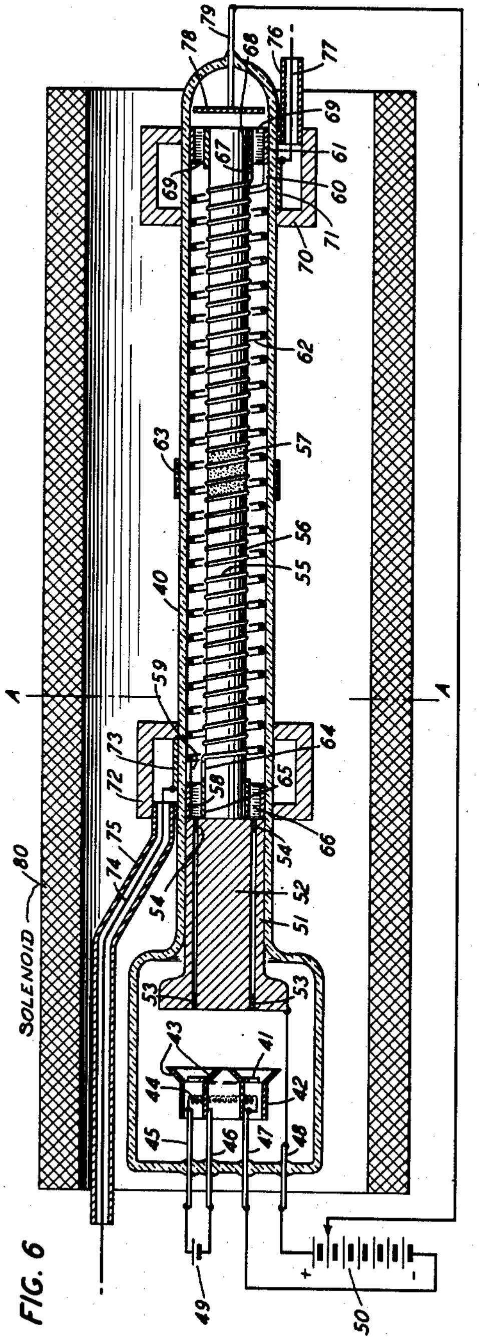
Fig. 6 shows a double helix type of tube according to the invention and employing a tubular electron beam.

Fig. 6 illustrates an embodiment of the invention utilizing as the wave circuit two concentric helices with a tubular electron beam projected through the cylindrical space between them. In this figure, 40 is a vacuum-tight envelope, which may be of glass, with a long straight central portion. The high frequency electrical wave circuit consists of a central helix 55 wound on a ceramic rod 56 and an outer helix 62 supported by the inside of the long straight portion of the glass envelope 40. These helices are wound in opposite directions and are wound with such a pitch that when separated the velocities of propagation for the two helices are very nearly equal. Under these circumstances, there will be a mode of propagation upon the helices in which the electric field mid-way between them will be substantially radial, having no longitudinal or axial component. There will also be a longitudinal mode of propagation; but if the helices are wound in opposite directions and if the spacing between them is small, the velocity of propagation of the longitudinal mode will be enough different from the velocity of propagation of the transverse or radial field mode that operation in the desired mode can be achieved merely by adjusting the electron velocity properly.

The above-described arrangement of two helices in which the helices are wound in opposite directions in order to separate the longitudinal and transverse modes of wave propagation is disclosed but not claimed in my copending application Serial No. 64,669, filed December 10, 1948, and issued as Patent 2,707,759, May 3, 1955.

At the input end, the outer helix 62 is connected to a collar 58 by a short straight section of wire 59. The inner helix 55 is connected to a collar 65 by a short straight section of wire 64. The inner collar 65 supports one end of ceramic rod 56. The inner collar 65 is supported from the outer collar 58 by two or more thin radial metal fins 66. The wires 64 and 59 are coupled to member 73, which is a thin strip projecting from one wall of a closed box-shaped structure 72. The outer conductor 75 of an input coaxial line is connected to the wall of the structure 72. The inner conductor 74 of the input coaxial line is connected to one end of member 73. Thus, an input signal on the input line 74, 75 is coupled to the helices 62 and 55 so as to excite the desired transverse mode of propagation of the wave therealong. The loss of the circuit can be controlled by the deposition of lossy material such as graphite on the ceramic rod 56 at 57 and on the envelope 40 at 63. At the output end of the tube, the inner helix 55 is connected by a short section of wire 67 to a collar 68 which supports one end of the ceramic rod 56. The outer helix 62 is connected by a short section of wire 60 to an outer collar 61 which rests against the glass envelope 40. Two or more thin metal fins 69 support the inner collar 68 from the outer collar 61. This output section is surrounded by a closed box-shaped enclosure 70, and near to the coupling wires 67 and 60, a coupling member 71 projects from the wall of the enclosure 70. The free end of this coupling member 71 is connected to the inner conductor 77 of the output coaxial line, the outer line conductor 76 being connected to the wall of the enclosure 70. An electron stream is produced by means of a cathode 42 with an annular portion 41 which is coated with emissive material. The cathode 42 is heated by coil heater 44, which is supplied by battery 49. The cathode 42 is supported by pins 46 and 47 which are sealed through the glass envelope 40. Another pin 45 serves to connect one end of the heater to one pole of the battery 49. The other end of the heater 44 is attached to the cathode 42. Around the cathode are focusing electrodes 43 which are held at cathode potential. Members 51 and 52 comprise an anode and collimating system. Member 52 has the form of a cylindrical rod with an outer diameter a little smaller than a cylindrical hole in member 51. Member 52 is supported concentrically in the hole in member 51 by narrow radial fin supports 53 and 54, thus leaving a thin cylindrical opening between members 51 and 52. The structure comprised of members 51 and 52 is connected by means of pin 48, sealed through the envelope 40, to the positive pole of battery 50, the negative pole of which is connected to cathode 42 by means of pin 47. The structure comprised of members 51 and 52 is also connected electrically to helices 55 and 62. A stream of electrons is drawn to the flat surface of the structure comprised of members 51 and 52, which is opposed to the emissive portion 41 of cathode 42. The long narrow aperture between members 51 and 52 allows a thin tubular stream of electrons to pass through, and the emerging stream will be comprised only of electrons with very small radial velocities. These electrons are injected in the space mid-way between helices 55 and 62 and so flow in a region in which the field of the circuit is substantially radial. The potential of battery 50 is adjusted so that the electrons comprising the hollow cylindrical beam injected between the helices have velocities near to the velocity of propagation of the radial or transverse mode of the wave. Thus, the electrons interact with this mode of propagation to amplify a signal impressed on input line 74, 75 and give an amplified output signal at output line 76, 77. The spent electrons are collected on electrode 78, which is supported and connected by pin 79 to a tap on battery 50. A longitudinal magnetic field produced by solenoid 80 which is supplied with excitation by means not shown serves to maintain the electron stream as a thin cylindrical sheet throughout its flow between helices 55 and 62.

Figure 7:
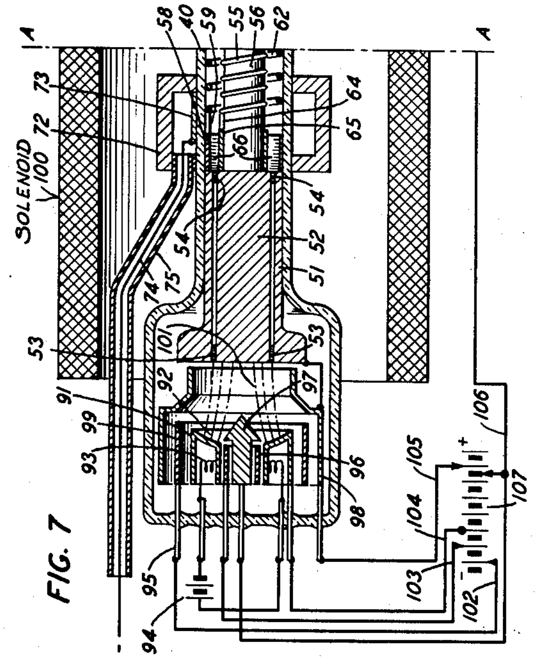
Fig. 7 shows an alternative type of electron gun which may be substituted in Fig. 6.

Fig. 7 illustrates the use in Fig. 6 of an alternative electron gun structure which is adapted to produce a hollow cylindrical electron beam from a cathode of comparatively large diameter. By this means, a more dense electron beam may be had from a cathode of a given diameter. The showing of Fig. 7 may be substituted in Fig. 6 for the portion ahead of the dashed line AA. Designations in Fig. 7 are the same as those in Fig. 6 where appropriate. The solenoid portion in Fig. 7 is designated 100 because while it takes the place of a part of the solenoid 80 in Fig. 6, it does not extend over the cathode, as the solenoid does in Fig. 6, because here it is desired to have the diverging lines of force at the end of the solenoid in the region in front of the cathode. A beam from such a gun may be used with the circuit structure of Fig. 6 for operation with either a longitudinal or a transverse slow wave or in other places where it is desirable to use a gun with a cathode of larger diameter than the electron beam.

In Fig. 7, the cathode 91 has an emissive portion 92 in the form of a zone of a sphere. The cathode 91 is connected to a tap 104 on battery 107. It is heated by means of a heater 93 which is connected to a battery 94. 96 and 99 are hollow cylindrical focusing electrodes which are connected to taps 103 and 102 on battery 107. This electron gun is designed to produce a converging cylindrical beam, as indicated by the dashed line at 101. To aid in forming and preserving the shape of this beam, a magnetic field is present formed by solenoid 100. To the left in this figure, from the end of this solenoid, the lines of magnetic force will diverge or fan out, and the solenoid is made of such diameter and is placed in such a position with respect to elements of the gun that the lines of force follow approximately the desired electron paths. Thus, the converging electron beam flows naturally along the lines of force and enters the magnetic field in an undisturbed manner where it is confined to its final diameter by the focusing action of the magnetic field.

Figure 8:
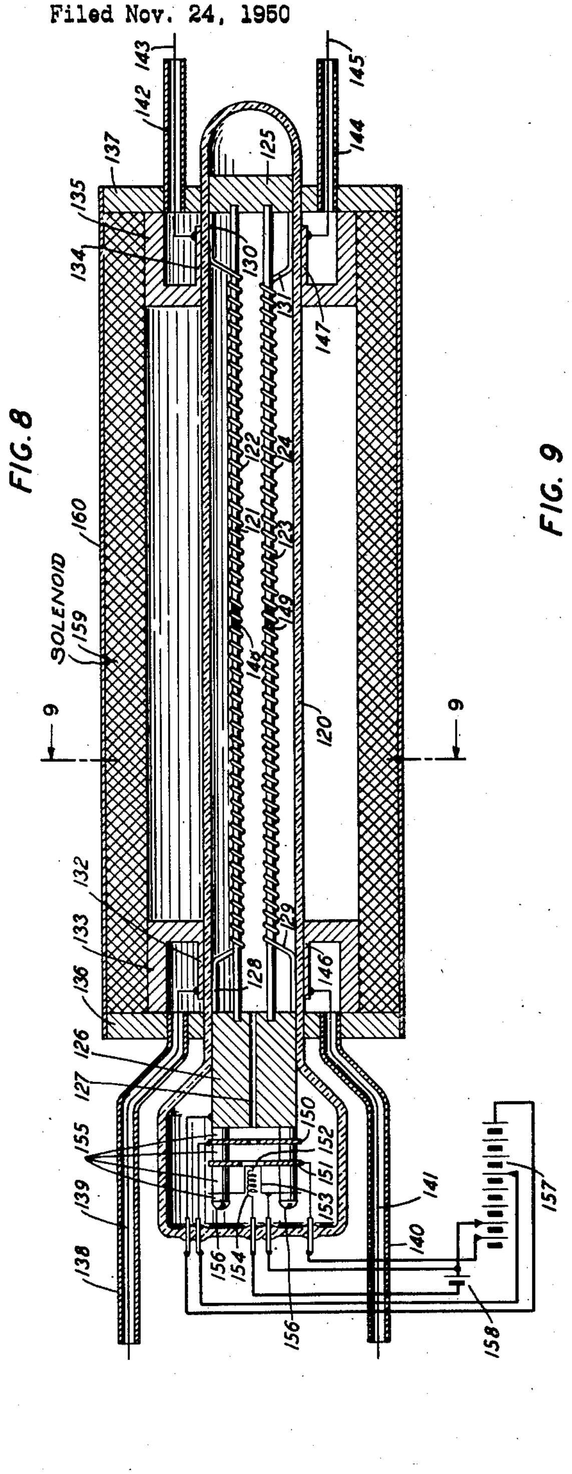
Fig. 8 shows a tube according to the invention employing two parallel flattened helices.
Figure 9:
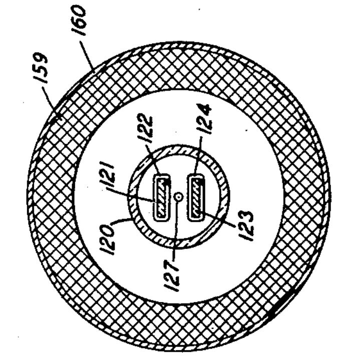
Fig. 9 shows a transverse section of the tube of Fig. 8.

Figs. 8 and 9 illustrate another embodiment of the invention, one in which an electron stream is projected along, between two parallel laterally spaced helices which constitute the slow wave transmission circuit. Fig. 9 is a sectional view at 9, 9 on Fig. 8. In these figures, 120 is a vacuum-tight envelope of glass or other suitable material in which are supported opposed flat coils of wire 122 and 124 wound on flat ceramic members 121 and 123. At the left-hand end, ceramic members 121 and 123 are supported from an anode and collimating structure 126 which rests in the envelope 120. At the right-hand end, the ceramic members 121 and 123 are supported by a metal member 125 which rests in the envelope 120. The coils 122 and 124 are excited at the input end by means of a balanced or push-pull signal applied to conductors 139 and 141 which are shielded by outer shields or ground conductors 138 and 140. Conductor 139 is connected to a coupling stub 132 which is coupled electrically and magnetically to a short section of wire 128 which connects the input end of coil 122 to electrode 126. Input conductor 141 is connected to one end of coupling stub 146, which is coupled electrically and magnetically to a short section of wire 129 which connects the input end of coil 124 to member 126. The other ends of stubs 132 and 146 are connected to a closed box-shaped member 133. The coupling stubs 132 and 146 and the wires 128 and 129 are proportioned to match impedances and transmit a signal applied to conductors 139 and 141 without reflection into the slow-wave transmission system consisting of coils 122 and 124. At the output end, coil 122 is connected by a short section of wire 130 to member 125. A coupling stub 134 in proximity to wire 130 provides electrical and magnetic coupling between this wire and output conductor 143. A coupling stub 147 in proximity to wire 131 provides coupling between coil 124 and output conductor 145. Conductors 143 and 145, together comprise the balanced output line of the tube and are shielded by conductors 142 and 144. The other ends of stubs 134 and 147 are secured to the closed box-shaped member 135. As is done at the input end, the coupling stubs 134 and 147 and the wires 130 and 131 are proportioned to match impedances and thus avoid reflections of energy at this part of the circuit. In the absence of electrons, an input signal impressed upon conductors 139 and 141 will travel along coils 122 and 124 in the form of an electromagnetic field traveling with a slow phase velocity. This field has a transverse component but substantially no longitudinal component of electric field along the axis of the tube mid-way between coils 122 and 124. As the wave reaches the output end, it will be matched out into the output line of conductors 143 and 145. Attenuation may be provided by putting lossy material, such as graphite or carbon, for instance, on ceramic rods 121 and 123 at 148 and 149. It is of the utmost importance that the coils 122 and 124 be wound in the same direction so that their electric and magnetic couplings add. If this is not done, there will be a longitudinal electric wave with substantially the same phase velocity as the desired transverse electric wave, and this wave will interfere with the desired operation of the tube.

An electron stream is produced from cathode 153 which is heated by heater 154 by means of battery 158. Cathode 153 has a plane disc-shaped emissive surface 152 which is surrounded by an apertured electrode 151. The plane face of electrode 126, which is opposed to the cathode, together with apertured electrode 150, electrode 151, and the cathode, form an electron gun. Ceramic washers or spacers 155 and screws 156 support and space the gun parts which are attached to electrode 126. Electrodes 151 and 150 and cathode 153 are connected to taps on battery 157, and electrode 126 is connected to the positive pole of that battery. The relative potentials of cathode 153 and electrodes 150 and 151 are adjusted by means of the taps so that a substantially parallel stream of electrons impinges on electrode 126. Electrode 126 has a central hole 127 of small diameter parallel to the axis of the tube and on the axis of the tube if it is symmetrical, as shown in Fig. 8. Such electrons as do not have substantial transverse or radial velocities pass through this hole and out along the axis of the tube between the coils 122 and 124. A solenoid 159 is used to produce a longitudinal magnetic focusing field to confine the electron beam in the region between coils 122 and 124. In order that the field shall not extend into the gun region of electrodes 153, 151, and 150 and down the narrow hole 127, electrode 126 is made of magnetic material which fits closely into the envelope 120, and another envelope-fitting magnetic element 136 is coupled magnetically to electrode 126 through the material of the envelope 120. A magnetic shield 160 is attached to element 136 and extends outside the solenoid 159 to another envelope-fitting magnetic element 137 at the other end of the tube. Electrode 125 may also be made of magnetic material so as to confine the magnetic field as nearly as possible to the space inside of the solenoid 159. Members 132, 133, 134, 135, 146, and 147 should not be of magnetic material. Neither should the wires 128, 129, 130, 131 nor the coils 122 and 124 be made of magnetic material. Thus, there will be a uniform magnetic field in the region inside the solenoid 159, but there will be substantially no magnetic field outside of the space enclosed by the magnetic members 160, 136, 137, 126 and 125, nor will there be appreciable magnetic field in the long narrow collimating aperture 127. It may be noted that here the magnetic focusing field is kept from the immediate vicinity of the cathode, whereas in the embodiments of Figs. 1 through 7, such a field is employed in the cathode region. In operation, a stream of electrons from the cathode will strike the entrance of aperture 127, and a stream from which all electrons with substantial transverse velocities have been eliminated will emerge from the right end of aperture 127. By proper adjustment of th potentials from battery 157, the speed of this stream of electrons can be made substantially equal to the velocity of the transverse slow wave propagated on coils 122 and 124, and the electrons will strongly interact with this wave to cause an amplification of the wave and an increase in its amplitude as it travels along the coils and by this mechanism gain will be produced in the tube.

Figs. 10 and 11, Fig. 11 being a sectional view, show an embodiment of the invention in which the wave circuit is a two-wire line loaded with short transverse wires on each line wire. These figures illustrate essentially a substitution of this type of wave transmission circuit for the two coils 122 and 124 in Figs. 8 and 9. Elements which are the same as similar elements in Figs. 8 and 9 are similarly designated. They function as in Fig. 8 and, therefore, need not be described here. In Fig. 10, 162 and 161 are longitudinal conductors of a two-wire transmission line connected between input coupling wires 128 and 129 and output coupling wires 130 and 131, as were the coils 122 and 124 in Fig. 8. This line is loaded by short transverse elements 167 and 166 such as wire or rods of conducting material which increase the capacitance per unit length of the line without changing its inductance and so reduce the phase velocity of a transmitted wave. The structure so formed is supported in the tube envelope 120 by apertured strips 168 which may be of mica or other suitable insulating material. The input coupling wires 128 and 129 are connected to electrode 126 and the output coupling wires 130 and 131 are connected to electrode 125, as in Fig. 8. The shielded input and output conductors, the magnetic focusing means with its shielding, the beam collimating electrode, circuit connections, and other features are as explained in the description of Fig. 8. The loaded line produces a transverse field, and operation of the device is like that of the Fig. 8 embodiment.

Figure 13:
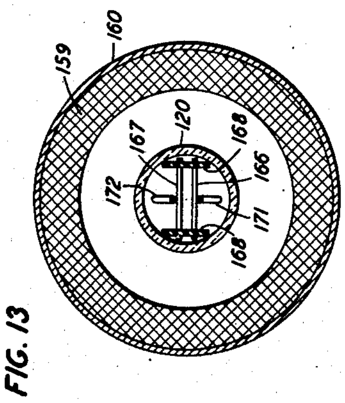
Fig. 13 shows a transverse section of the tube portion shown in Fig. 12.
Figure 12:
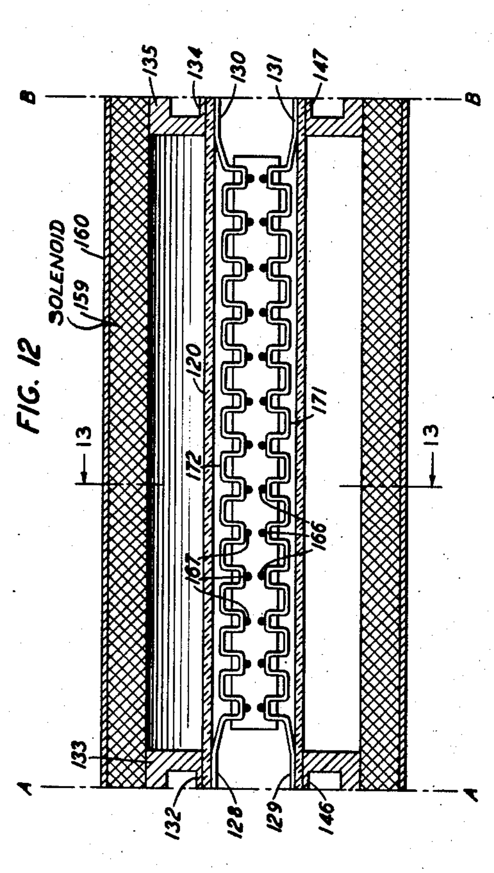
Fig. 12 illustrates an alternative form of wave circuit which may be substituted for that shown in Fig. 10. This circuit is similar to that of Fig. 10 but with the line wires bent in serpentine shape.

Figs. 12 and 13 illustrate a modification of the circuit of Fig. 10 in which the wires 167 and 166, which correspond to the similarly designated elements of Fig. 10, are attached to longitudinal wires 172 and 171 of serpentine form, which correspond in the circuit to the longitudinal line conductors 162 and 161 of Fig. 10. This serpentine form adds inductance to the line and hence further reduces the phase velocity of the wave. The line structure may be supported in the tube envelope 120 by means of apertured strips 168, of mica or other suitable material, as in Fig. 10. Like the circuit shown in Fig. 10, the Fig. 12 circuit may take the place of the coils 122 and 124 of Fig. 8. The showing of Fig. 12 may be substituted between the dashed lines AA and BB of Fig. 10. Like Fig. 10, operation will be similar to that of Fig. 8. Elements in Figs. 12 and 13 which are the same as elements in Figs. 10 and 11 are similarly designated and require no further description.

Figure 15:
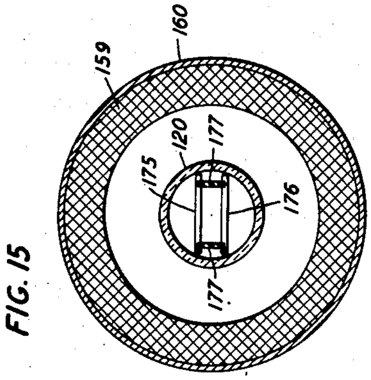
Fig. 15 shows a transverse section of the tube portion shown in Fig. 14.
Figure 16:
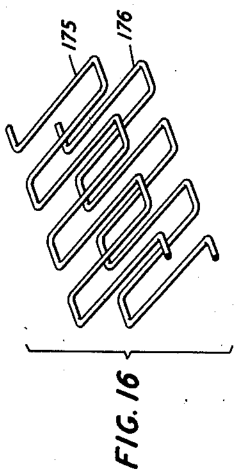
Fig. 16 illustrates the shape and positions of the two parallel wires of the circuit of Fig. 14.
Figure 14:
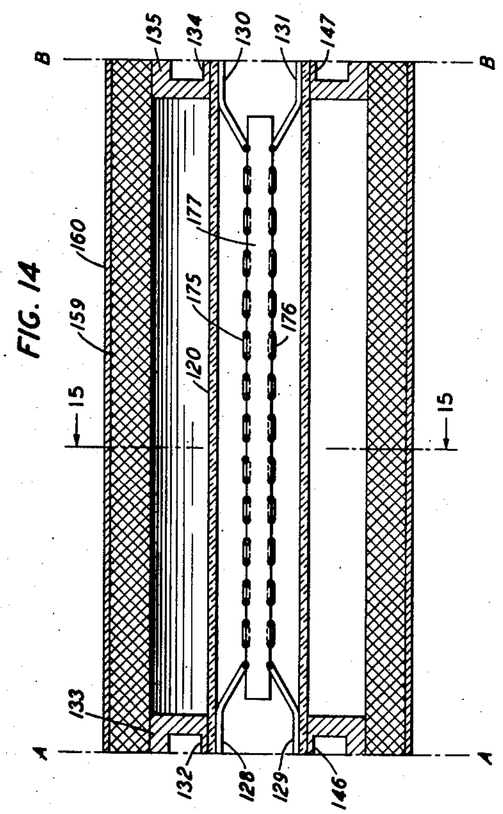
Fig. 14 illustrates another form of wave circuit which may be substituted for the one shown in Fig. 10. This circuit consists of a parallel pair of wires in serpentine shape.

Figs. 14, 15 and 16 illustrate another circuit structure which also may be used, for instance, in place of the opposed coils 122 and 124 of Fig. 8. The showing of Fig. 14 may be substituted in Fig. 10 between the dashed lines AA and BB, and operation will be the same as described for Fig. 8. Here a two-wire balanced transmission line consists of wires 175 and 176 which have been bent into a serpentine shape and disposed as indicated in Fig. 16. A wave will progress with about the velocity of light along the wires and hence at a considerably less velocity along the structure as a whole. The wires 175 and 176 may be supported by notched insulating strips 177 which may be of mica. The wires and the supporting strips may be fitted into the envelope 120, as shown in Fig. 15. Input and output circuits may be coupled to the balanced line 175, 176 by means of the coupling wires 128, 129, 130 and 131, as in the Figs. 8, 10, 12 embodiments. As in the showings of those embodiments, the common elements are designated in Figs. 14 and 15 as in the preceding figures.

Figures 17, 18, 19:
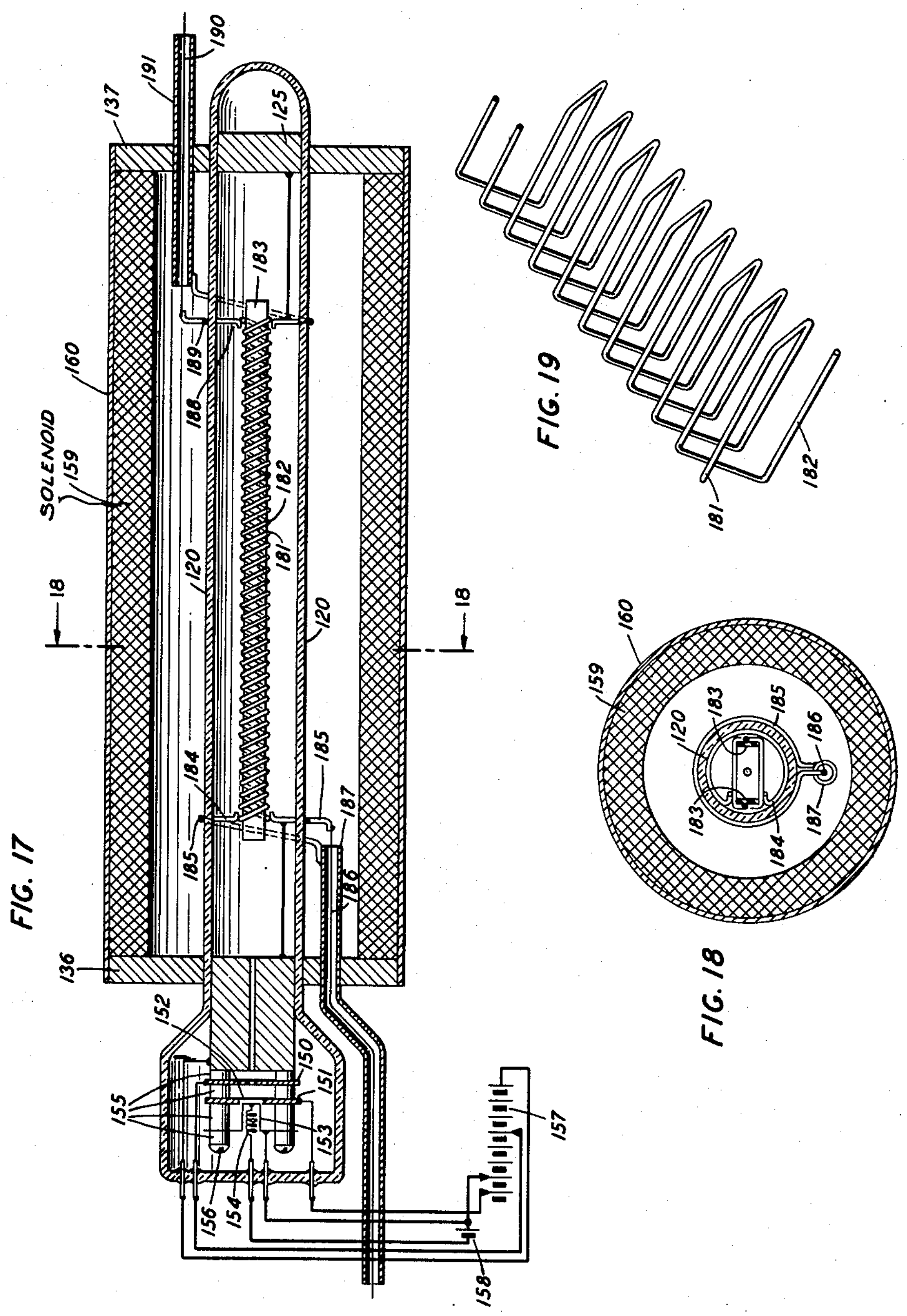
Fig. 17 shows a tube according to the invention employing a wave circuit consisting of two wires wound as a bifilar flattened coil.
Fig. 18 shows a transverse section of the tube of Fig. 17.
Fig. 19 shows the positions of the wires of the coil of Fig. 17 and is useful in explaining the operation of the coil.

Figs. 17, 18 and 19 illustrate another type of circuit which may be used for producing a transverse field in a traveling wave tube. As an example, in Fig. 17, this circuit is shown in a tube utilizing an electron gun, tube envelope, and solenoid, as shown in Fig. 8. In Fig. 17, these parts are designated as in Fig. 8, and they function as explained in the description of Fig. 8.

The wave circuit of Fig. 17 is a bifiliar flattened coil wound of wires 181 and 182. The winding may be supported by insulating strips 183, which may be of mica or other suitable material. The coil assembly is mounted in the envelope 120 axially aligned with the electron gun, as shown in the sectional view Fig. 18. To achieve coupling at the input end of the coil, the wires 181 and 182 are joined by a coupling loop fitting inside the envelope 120. This loop is coupled through the envelope 120 to a coupling loop 185 which is connected at its ends to the conductors 186 and 187 of an input coaxial line. Similar coupling means are employed at the output end of the coil utilizing coupling loops 188 and 189 and output coaxial line conductors 190 and 191. Fig. 19 is a sketch showing the bifilar coil in perspective. To understand the operation of this bifilar coil in producing a slow transverse electric field component, it may be imagined that over a short longitudinal distance, wire 181 is positive in a high frequency sense and wire 182 is negative. Then at one position, 181 will be above and wire 182 will be below. A half turn ahead, wire 182 will be above and wire 181 will be below. It is thus seen that there will be a transverse field component of short longitudinal wavelength and hence of low phase velocity which may be made to interact with a well-collimated electron beam in the same manner as in the previously described tubes to provide amplification with low noise.

Figure 20:
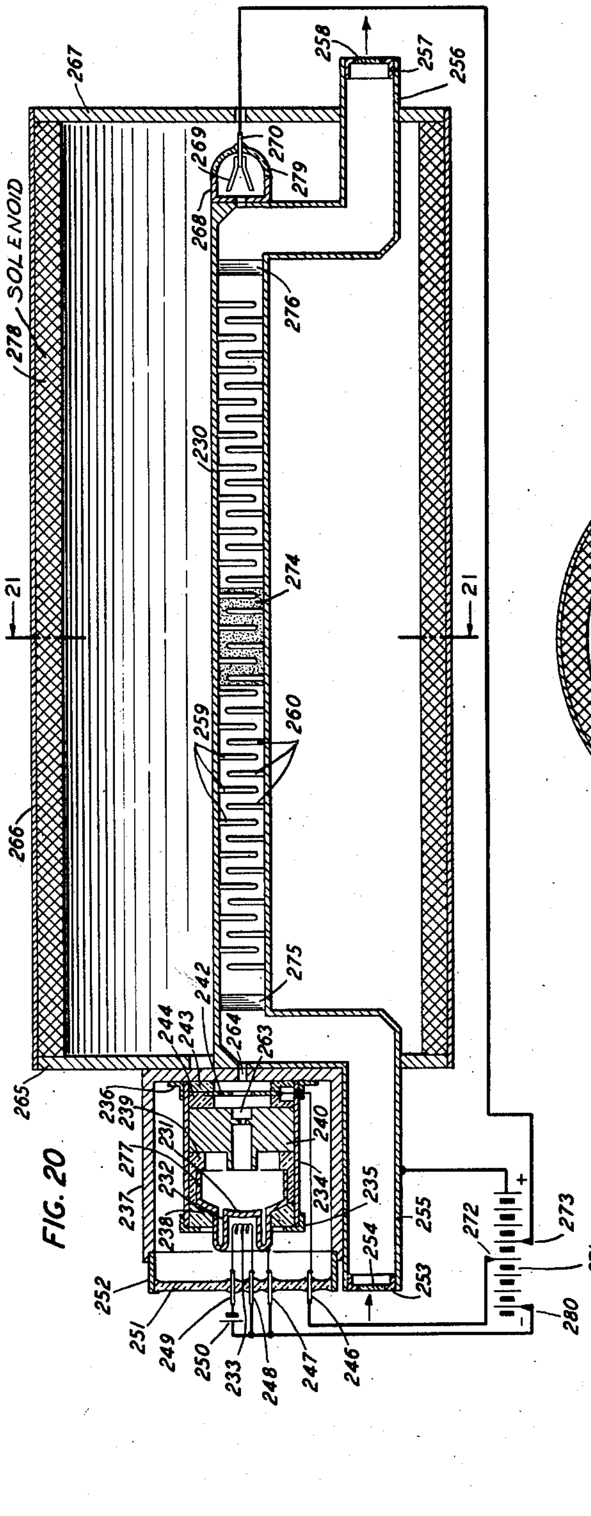
Fig. 20 shows a tube employing as a wave circuit a wave guide containing rows of metallic pins projecting inward from the walls of the guide.
Figure 21:
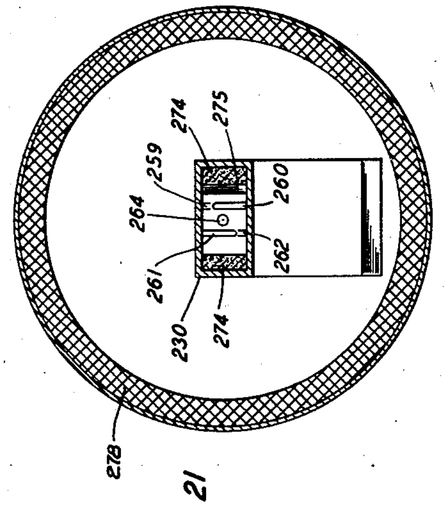
Fig. 21 shows a transverse section of the tube of Fig. 20.

Figs. 20 and 21 illustrate an embodiment of the invention utilizing as the slow transmission circuit a wave guide with pins projecting from the interior walls. In Fig. 20, the vacuum-tight envelope 230 is in the form of a wave guide of conducting material. A high frequency input signal may enter this wave guide through ceramic or glass window 254, which is sealed in a vacuum-tight manner by means of flange 253 to input portion 255 of the wave guide. An output signal may leave the output end 256 of the wave guide through ceramic or glass window 258 which is sealed to the wave guide portion 256 by means of flange 257. In the central portion of the wave guide, conducting pins 259, 260, 261 and 262 project normal to the walls of the wave guide in the direction which would be the direction of the electric field in the absence of the pins. In the row of interleaved pins 259 and 260, the pins are connected alternately to the top and bottom of the wave guide. In a similar row, the pins 261 and 262 are also connected alternately to the top and bottom of the wave guide. Opposite pins 259, which are connected to the top of the wave guide, there will be pins 262, which are connected to the bottom of the wave guide; and opposite pins 260, which are connected to the bottom of the wave guide, there will be pins 261, which are connected to the top of the wave guide. Suppose, for instance, that in a given longitudinal region, the top of the wave guide is regarded as positive, and the bottom of the wave guide as negative in a high frequency sense. Then traveling along the plane in which pins 259 and 260 lie, one will alternately pass positive and negative pins. Opposite each positive pin 259, there will be a negative pin of the row 262, and opposite each negative pin 260, there will be a positive pin of row 261. Thus, it will be seen that when a wave travels along the wave guide 230, it will produce a transverse electric field of short wavelength and hence of low phase velocity in the space between the rows of pins 259, 260 and 261, 262. The presence of the pins will cause alteration in the impedance of the wave guide and in order to avoid reflections at the ends of the rows of pins, inductive matching posts 275 and 276 are provided. These are of conducting material. One of them connects the top and bottom of the wave guide at each end of the rows of pins.

An input signal entering the window 254 will travel through the structure and emerge through window 258. In so doing, it will produce a transverse electric field component of short wavelength traveling along in the axis of the wave guide centrally between the rows of pins 261, 262 and 259, 260. Attenuation between input and output may be provided by means of lossy ceramic members 274 located in the sides of the wave guide near the center. These members may be of a mixture of ceramic and conducting material or other material capable of absorbing energy from a high frequency electric field.

In order to produce an electron stream, a cathode 232 is heated by a heater 233, which is connected by leads 248 and 249 to battery 250. The cathode has an emissive surface 231 in a concave spherical form and about this surface is a focusing electrode 277. The cathode 232 and the focusing electrode 277 are supported by ceramics 238 and 239 so that they are opposed to anode electrode 240. Lens electrode 242 with a central aperture is supported near to the electrode 240 by means of ceramic members 243 and 244. The ceramic members 238, 239, the electrode 240, and the ceramic members 243 and 244 are held in place by a cylindrical member 234 and are retained by flanged member 235 connected to cylindrical member 234, which is attached by flange 236 to structural element 237. A thin cylindrical member 252 is brazed to element 237, and the disc 251, which may be of glass, is sealed into member 252. Pins 246, 247, 248 and 249 are sealed through the disc 251. Cathode 232 is connected to the negative portion of battery 271 through tap 280, and focusing electrode 277 is held at cathode potential. Anode electrode 240 is connected through members 234 and 237 and envelope 230 to the positive pole of battery 271. The cathode surface 231, the focusing electrode 277, and electrode 240 form an electron gun which produces a conical beam focused on the small aperture 263. Electrons which are emitted from the cathode with a substantial thermal velocity component parallel to the cathode surface miss aperture 263 and are lost. Thus, aperture 263 serves to eliminate electrons which might have transverse velocity components when formed into a beam. From aperture 263, a conically diverging beam of electrons emerges. Lens electrode 242, which is connected to tap 272 on battery 271, is adjusted in potential so that the conical beam which emerges from aperture 263 is focused into a parallel beam which passes through aperture 264 in member 237. A solenoid 278 produces a uniform magnetic field to the right of member 237, which is of magnetic material, so that the electron gun structure is in a region free of magnetic field, and the electron beam emerging from aperture 264 emerges into this magnetic field. The magnetic field is confined to the interior of the solenoid by magnetic shield members 265, 266 and 267. The substantially parallel beam emerging from the aperture 264 passes through the length of the envelope 230 in the high frequency field between the pins 259, 260 and 261, 262 and is finally collected on collector 269. Collector 269 is supported by pin 270 which is sealed into the dome-shaped member 279 which may be of glass and is in turn sealed to a thin metal eyelet 268 which is secured in a vacuum-tight manner to envelope 230. The collector 269 is connected to tap 273 of battery 271. The potential of battery 271 is adjusted so that the electrons emerging from aperture 264 have a velocity substantially equal to the phase velocity of the transverse field component between pins 259, 260 and 261, 262. Thus, the electron stream interacts strongly with this field component to give traveling wave gain.

Figure 22:
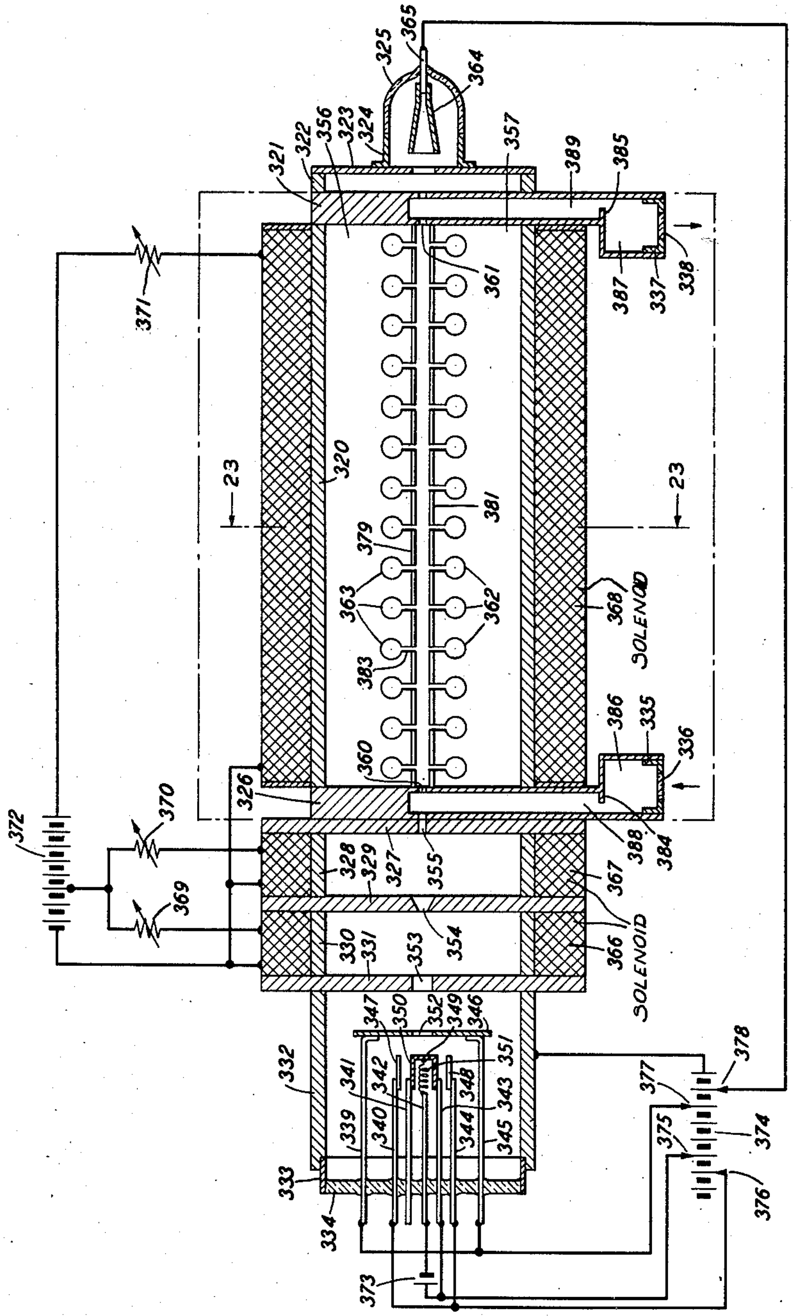
Fig. 22 shows a tube which employs in the wave circuit a series of resonators cut in metal sheets.
Figure 23:
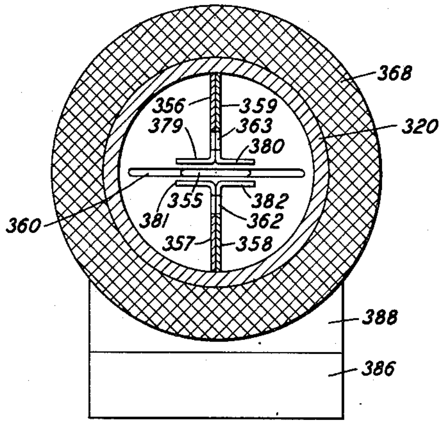
Fig. 23 shows a transverse section of the tube of Fig. 22.

Figs. 22 and 23 illustrate another means for realizing objectives of this invention. In this embodiment, the circuit for producing a slow electromagnetic wave with a transverse electric field in the region of electron flow, which is along the axis of the extended circuit, is made up of a number of resonator cavities 363 and 362 cut in metal sheets 356, 359, 357 and 358 and having projecting opposed capacitive portions 379, 380, 381 and 382. The resonator cavities 362 and 363 form the inductance elements of a filter circuit, and the bent-out portions 379, 380, 381 and 382 form the capacitive elements. The plates 356, 359, 357 and 358 are supported by the cylindrical portion 320 of the vacuum-tight envelope of the tube which may be of glass. An input signal is applied through the vacuum-tight window 336, which is sealed by means of a flange 235, to an input wave guide 386, which is coupled to an input wave guide section 388 cut in element 326 and matched to it by capacitive element 384. The input wave guide 388 is coupled by a narrow aperture 360 to the input end of the slow wave circuit comprising the resonator cavities 363 and 362 by a narrow aperture 360. The output end of the slow wave circuit is coupled by a narrow aperture 361 to an output wave guide 389 which is cut into element 321 and is matched to the output wave guide 387 by a capacitive element 385. Output power may flow from the wave guide 387 through window 338, which may be of glass, and is sealed into flange 337. In the absence of electrons, input power applied through window 336 will flow without reflection into the slow wave circuit comprising resonators 362, 363, etc., and will progress as a slow wave with only a transverse field on the axis down into the output wave guide and without reflection will pass out through the output window 338.

An electron stream is formed by means of cathode 350, focusing electrodes 347, 348 and 346, and by means of magnetic lenses which act between magnetic pole pieces 331 and 329 and 329 and 327. Cathode 350 is supported by pins 341 and 343 which are sealed through the envelope portion 334 which may be of glass. In turn, the portion 334 is sealed to magnetic shield member 332 by means of a thin cylindrical metal portion 333. Cathode 350 is heated by coil heater 351, one end of which is connected to the battery 373 through pin 342 and the other end of which is connected to cathode 350 and thence by pin 343 to battery 373. Cathode 350 has a disc-shaped emissive portion 349. Close to cathode 350 are electrodes 347 and 348 which are supported by pins 340 and 344 and connected therethrough to a tap 376 on battery 374. Focusing electrode 346 is supported by pins 339 and 345 and is connected to a tap 377 on battery 374. The potentials applied to electrodes 347, 348 and 346 from battery 374 are so adjusted as to produce a substantially parallel ribbon beam of electrons which passes through the aperture 353 of electrode and pole piece 331. A coil 366 excited from battery 372 with a current controlled by rheostat 369 produces a magnetic focusing field between pole pieces 329 and 331 which are connected in a vacuum-tight manner by non-magnetic envelope member 330. This magnetic field serves to focus the electron flow which passes through aperture 353 on a narrow slit 354 in pole piece 329. Electrons which leave the cathode with very small transverse velocities are able to pass through the narrow slit 354, but electrons which have substantial transverse velocity in the direction normal to the slit 354 on leaving the cathode are lost on the surface of electrode 329 which faces the cathode and surrounds the aperture 354. The electron flow emerging from the narrow aperture 354 is straightened out by a magnetic focusing field between pole pieces 329 and 327 which are connected in a vacuum-tight manner by a non-magnetic cylindrical envelope member 328. This magnetic focusing field is produced by means of coil 367 which is excited from battery 372 with a current controlled by rheostat 370. Thus, a substantially parallel electron flow is produced which passes aperture 355 in pole piece 327 and in which electrons have, because of the aperturing they have all undergone, very small transverse velocities in the direction normal to the long extent of apertures 354 and 355, this direction being the direction of the electric field in the slow wave circuit comprising resonators 362, 363, etc. This parallel beam of electrons passes through slit 355 in pole piece 327 and through coupling slit 360 of the input wave guide 388 into the plane of symmetry of the slow wave circuit, where it is confined by a magnetic field produced by solenoid 368 which is excited from battery 372 with a current controlled by rheostat 371. It is understood that rheostats 369, 370 and 371 and taps 375, 376 and 377 are to be adjusted to give the focusing of the electron stream which results in amplification with the least noise. After traversing the slow wave structure, the electron stream passes through aperture 361 and apertures in elements 321 and 323 and is collected by collector electrode 364 which is supported by a pin 365 sealed in a glass dome 325 sealed to an eyelet 324 which is secured in a vacuum-tight manner to plate 323. These and other structural elements 323, 322, 321, 320, 326, 327, 328, 329, 330, 331, 332, 333 and 334 are joined in a vacuum-tight manner to form the vacuum-tight envelope of the tube. The potential of battery 374 is so adjusted that the electrons emerging from the slit 360 have a velocity near to the velocity of the wave in the slow wave structure and hence they interact with this wave in this structure in a manner to give a large traveling wave type of gain.

Figure 24:
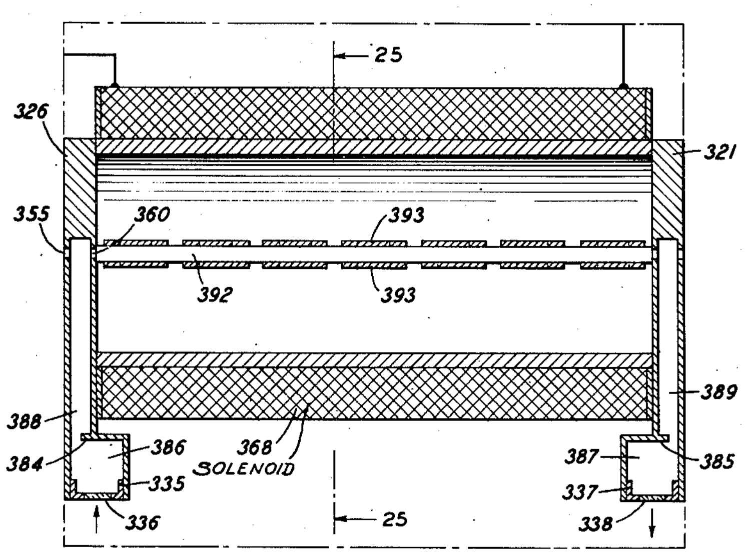
Fig. 24 shows an alternative type of circuit, employing a number of plates attached to two longitudinal members, which may be substituted in Fig. 22.
Figure 25:
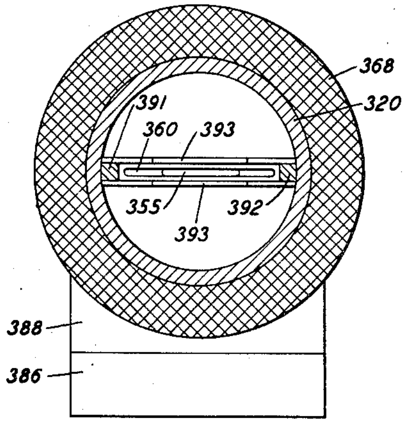
Fig. 25 shows a transverse section of the tube portion shown in Fig. 24.
Figure 26:
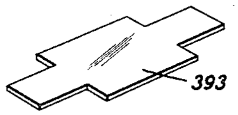
Fig. 26 illustrates one of the plates employed in the circuit of Fig. 24.

Figs. 24, 25 and 26 illustrate a simple coupled resonator type of slow wave structure which may be employed to produce a transverse traveling electric field and may, for example, be substituted for the slow wave circuit in the Fig. 22 embodiment of the applicant's invention. The showing of Fig. 24 may be substituted for the portion enclosed in the broken lines of Fig. 22. The circuit of Fig. 24 and further illustrated in Figs. 25 and 26 is made up of two longitudinal metallic members 391 and 392 to which a number of flat horizontal plates 393 are brazed or welded above and below and extending spaced from each other along the length of members 391 and 392, as shown. The electron stream emerging from slit 360 passes along the center opening between members 391 and 392 and the plates 393 attached to the upper and lower sides thereof. Along that opening, the electron stream interacts with the transverse electric field produced there by an electric wave traveling along the circuit from the input wave guide 388 to the output wave guide 389 and effects a gain in the wave energy as in the previously-described embodiments of the invention.

What is claimed is:

1. A high frequency electronic amplifier comprising a cathode, means for producing an electron stream along an extended path from said cathode, a transmission circuit having an input end and an output end extending along said path and being capable of propagating an electromagnetic wave in the direction of said path at a practical electron velocity with a traveling alternating electric field in said path substantially perpendicular to the direction thereof, and apertured electrode means located in said path between the cathode and the position of said alternating electric field defining a narrowed elongated portion of the electron path, whereby the electron stream entering said alternating electric field is rendered free of electrons having substantial velocity components perpendicular to the direction of the stream.

2. A high frequency electronic amplifier comprising a cathode, means for producing an electron stream along an extended path from said cathode, a transmission circuit having an input end and an output end extending along said path and being capable of propagating an electromagnetic wave in the direction of said path at a practical electron velocity with a traveling alternating electric field in said path substantially perpendicular to the direction thereof and apertured electrode means located in said path between the cathode and the position of said alternating electric field defining a narrowed elongated portion of the electron path, whereby the electron stream entering said electric alternating field is rendered free of electrons having substantial velocity components perpendicular to the direction of the stream, said apertured electrode means comprising means for eliminating from the electron stream electrons having such said velocity components.

3. A high frequency electronic amplifier comprising a cathode, means for producing an electron stream along an extended path from said cathode, a transmission circuit having an input end and an output end extending along said path and being capable of propagating an electromagnetic wave in the direction of said path at a practical electron velocity with a traveling alternating electric field in said path substantially perpendicular to the direction thereof and apertured electrode means located in said path between the cathode and the position of said alternating electric field defining a narrowed elongated portion of the electron path, whereby the electron stream entering said alternating electric field is rendered free of electrons having substantial velocity components perpendicular to the direction of the stream, said apertured electrode means comprising means for directing substantially all of the electrons from the cathode into a stream in which the electrons are free of such said velocity components.

4. A device according to claim 1 in which said apertured electrode means comprises an elongated tubular aperture axially aligned with the path of the electron stream.

5. A device according to claim 1 in which said apertured electrode means comprises an elongated tubular aperture axially aligned with the path of the electron stream and having a length at least ten times its width.

6. A device according to claim 1 in which said apertured electrode means comprises an elongated annular aperture axially aligned with the path of the electron stream.

7. A device according to claim 1 in which said apertured electrode means comprises an elongated annular aperture axially aligned with the path of the electron stream and having a length at least ten times its radial width.

8. A device according to claim 1 in which said apertured electrode means comprises two apertured electrodes spaced from each other and from the cathode along said path with the apertures in the path, means for producing a unidirectional magnetic field in the direction of the path in the region between said electrodes and means for maintaining said electrodes at different potentials positive with respect to the potential of the cathode, the apertures acting as electron lenses to an electron stream passing therethrough and giving equal changes in radial electron velocity.

9. A device according to claim 1 in which said apertured electrode means comprises two apertured electrodes spaced from each other and from the cathode along said path with the apertures in the path, means for producing a unidirectional magnetic field in the direction of the path in the region between said electrodes and means for maintaining said electrodes at different potentials positive with respect to the potential of the cathode, the spacings and the potential differences between the electrodes and the cathode being related substantially according to the expression $$\frac{L_2}{L_1}=\frac{3}{4}\left(\sqrt{\frac{V_1}{V_1}}+1\right)\left(\frac{V_2}{V_1}-1\right)$$

where $L_1$=distance between the cathode and the nearer electrode $L_2$=distance between electrodes $V_1$=potential difference between the cathode and the near electrode $V_2$=potential difference between the cathode and the farther electrode.

10. A device according to claim 1 in which said apertured electrode means comprises two apertured electrodes spaced from each other and from the cathode along said path with the apertures in the path, means for producing a unidirectional magnetic field in the direction of the path in the region between said electrodes and means for maintaining said electrodes at different potentials positive with respect to the potential of the cathode, the potentials of the apertured electrodes and the strength of the unidirectional magnetic field between the electrodes being such that the electron transit time between the apertures is substantially equal to the period of an odd number of half cycles of the cyclotron period of the said magnetic field.

11. A device according to claim 1 in which said apertured electrode means comprises two apertured electrodes spaced from each other and from the cathode along said path with the apertures in the path, means for producing a unidirectional magnetic field in the direction of the path in the region between said electrodes and means for maintaining said electrodes at different potentials positive with respect to the potential of the cathode, the potentials of the apertured electrodes, the strength of the unidirectional magnetic field and the spacing between the electrodes being so related that the strength of the magnetic field in gauss is substantially $$B=5.28\frac{(2n+1)\sqrt{V_1}\left(\sqrt{\frac{V_2}{V_1}}+1\right)}{L_2}$$

where $B$=magnetic field strength in gauss $n$=any integer $V_1$=potential difference between the cathode and the nearer electrode in volts, $V_2$=potential difference between the cathode and the farther electrode in volts, $L_2$=distance between the eletcrodes in centimeters.

12. A device according to claim 1 in which said apertured electrode means comprises two apertured electrodes spaced from each other and from the cathode along said path with the apertures in the path, means for producing a unidirectional magnetic field in the direction of the path in the region between said electrodes and means for maintaining said electrodes at different potentials positive with respect to the potential of the cathode, the spacings and the potential differences between the electrodes and the cathode being related substantially according to the expression $$\frac{L_2}{L_1}=\frac{3}{4}\left(\sqrt{\frac{V_1}{V_2}}+1\right)\left(\frac{V_2}{V_1}-1\right)$$

where $L_1$=distance between the cathode and the nearer electrode, $L_2$=distance between electrodes, $V_1$=potential difference between the cathode and the nearer electrode, $V_2$=potential difference between the cathode and the farther electrode, and the strength of the unidirectional magnetic field between the electrodes in gauss is substantially $$B=5.28\frac{(2n+1)\sqrt{V_1}\left(\sqrt{\frac{V_2}{V_1}}+1\right)}{L_2}$$

where $B$=magnetic field strength in gauss,
$n$=any integer,
$V_1$=potential difference between the cathode and the nearer electrode in volts,
$V_2$=potential difference between the cathode and the farther electrode in volts,
$L_2$=distance between the electrodes in centimeters.

13. A device according to claim 1 in which said transmission circuit comprises a portion of hollow wave guide of conducting material the longitudinal axis of which coincides with the axis of said electron path, a series of members of conducting material attached to and projecting inwardly from opposite walls of said wave-guide portion, said members being spaced from each other longitudinally along the guide portion and projecting inwardly to nearly reach the axis of the guide leaving said path along the axis adjacent to said members clear for passage of the electron stream, loss material capable of absorbing energy from a high frequency field located in the wave-guide portion along said path and a pair of conducting members connecting opposite walls of the wave-guide portion at each end of said series of inwardly projecting members to match the impedance of said wave-guide portion to input and output wave guides connected thereto.

14. A device according to claim 1 in which said transmission circuit comprises two conductors in the form of two oppositely wound elongated helices in coaxial arrangement with an annular space between them along which the electron stream is projected, at each end of the helices a pair of hollow cylinders coaxial with and having substantially the same respective diameters as the helices, each said hollow cylinder being connected to the adjacent end of the helix of similar diameter by a length of coupling conductor, at one end of the helices an input coupling conductor connected to a high frequency input circuit coupled to the said lengths of coupling conductor at that end, at the other end of the helices an output coupling conductor connected to a high frequency output circuit coupled to the said lengths of coupling conductor at that end and loss material capable of absorbing energy from a high frequency field located in the field space of each said helix.

15. A device according to claim 1 in which said transmission circuit comprises two conductors in the form of elongated helices axially parallel and spaced apart laterally with a space between and external of each for said path of the electron stream, the helices being flattened on the sides facing each other, at each end of the helices each helix being connected by means of a length of coupling conductor to a common conducting member, the two said coupling conductors at one end of the helices being coupled separately through input coupling members to opposite sides of an input circuit, the two said coupling conductors at the other end of the helices being coupled separately through output coupling members to opposite sides of an output circuit and loss material capable of absorbing energy from a high frequency field located in the fields of the helices.

16. A device according to claim 1 in which said transmission circuit comprises a portion of hollow conducting wave guide, the longitudinal axis of which coincides with the axis of said electron path, a series of conducting pins attached to and projecting inwardly from two opposite walls of said wave-guide portion, said pins being spaced from each other along the length of said guide portion and arranged in two rows on opposite sides of the axis of said electron path leaving space along the path axis for passage of the electron stream, all of said pins extending from the points of attachment to more than half way across the wave guide, alternate pins of each said row projecting from a different said opposite wall, the pins projecting from one of said opposite walls in one said row being opposite the pins projecting from the other said opposite wall in the other said row and a conducting member connecting said opposite walls of the wave-guide portion at each end of the series of inwardly projecting pins to match the impedance of said wave-guide portion to that of input and output wave guides connected thereto.

17. A device according to claim 1 in which said transmission circuit comprises a series of resonators and capacitive elements combined to form a filter type circuit distributed along said electron path, said series of resonators being in the form of slot-like openings cut in and along an edge of each of a plurality of metal sheets lying substantially in the plane of the axis of said electron path, said edges extending along parallel to said axis one on each of two opposite sides thereof with said openings facing said axis and with the openings on one side directly opposite the openings on the other side, said series of capacitive elements comprising a plurality of flat metallic members conductively attached along said edges of said sheets, one said member between each pair of adjacent openings, said members projecting at an angle from said sheets, those attached to a sheet on one side of said axis being opposite to and spaced from those attached to a sheet on the other side of said axis and in cooperative relation to form said capacitive elements distributed along said circuit between said resonators, said circuit being coupled at the two ends of said series of resonators and capacitive elements, to an input wave guide and an output wave guide respectively.

18. A high frequency wave transmission circuit comprising a plurality of pins of conducting material substantially equal in length positioned transverse to the direction of wave transmission and spaced apart laterally, substantially parallel to each other, in the direction of wave transmission, adjacent ends of alternate said pins being connected together and to the opposite ends of the others of said pins, which are interleaved with said alternate pins, by a conducting member in the form of a shell which extends along and surrounds said plurality of pins.

19. A device according to claim 1 comprising means for producing a uniform unidirectional magnetic field along the path of the electron stream and extending to include the cathode.

20. A device according to claim 1 comprising means for producing a unidirectional magnetic field along the path of the electron stream and means for keeping said magnetic field from the region of the cathode.

21. A high frequency electronic amplifier comprising a cathode, means for producing an electron stream along an extended path from said cathode, a transmission circuit having an input end and an output end extending along said path and being capable of propagating an electromagnetic wave in the direction of said path at a practical electron velocity with a traveling alternating electric field in said path preponderantly perpendicular to the direction thereof, and apertured electrode means located in said path between the cathode and the position of said alternating electric field defining a narrowed elongated portion of the path, whereby the electron stream entering said alternating electric field is rendered free of electrons having substantial velocity components perpendicular to the direction of the stream.

22. A high frequency electronic amplifier of the traveling wave type comprising a wave transmission circuit having an input end and an output end and being capable of propagating an electromagnetic wave having associated therewith an alternating electric field traveling along said circuit at a practical electron velocity and being transverse to the direction of travel, means for projecting an electron stream along said circuit in the path of said transverse alternating electric field to interact therewith, and apertured electrode means located in the path of said electron stream defining a narrowed elongated portion of the stream path whereby the electron stream entering said transverse alternating electric field is rendered free of electrons having substantial velocity components transverse to the direction of travel of the stream.

23. A high frequency electronic amplifier of the traveling wave type comprising a wave transmission circuit having an input end and an output end and being capable of propagating an electromagnetic wave having associated therewith an alternating electric field traveling along said circuit at a practical electron velocity and being transverse to the direction of travel, means for energizing said transmission circuit to produce said traveling transverse alternating field, means for projecting an electron stream along said circuit in the path of said transverse alternating electric field to interact therewith, and apertured electrode means located in the path of said electron stream defining a narrowed elongated portion of the stream path whereby the electron stream entering said transverse alternating electric field is rendered free of electrons having substantial velocity components transverse to the direction of travel of the stream.

24. An electronic device according to claim 1 in which the transmission circuit comprises a pair of concentric helices which are of different radii and are wound in opposite senses and the electron stream flows along a path in the annular space between the concentric helices in the region where the traveling alternating electric field is substantially radial.

References Cited in the file of this patent

UNITED STATES PATENTS

| | | |
|---|---|---|
| 1,978,021 | Hallmann | Oct. 23, 1934 |
| 1,991,282 | Kohl | Feb. 12, 1935 |
| 2,035,623 | Sukumlyn | Mar. 31, 1936 |
| 2,061,387 | Prinz | Nov. 17, 1936 |
| 2,064,469 | Haeff | Dec. 15, 1936 |
| 2,081,942 | Lubcke | June 1, 1937 |
| 2,096,460 | Llewellyn | Oct. 19, 1937 |
| 2,138,928 | Klemperer | Dec. 6, 1938 |
| 2,181,850 | Nicoll | Nov. 28, 1939 |
| 2,211,859 | Percival | Aug. 20, 1940 |
| 2,241,976 | Blewett et al. | May 15, 1941 |
| 2,511,407 | Kleen et al. | June 13, 1950 |
| 2,541,843 | Tiley | Feb. 13, 1951 |
| 2,578,434 | Lindenblad | Dec. 11, 1951 |
| 2,580,007 | Dohler et al. | Dec. 25, 1951 |
| 2,584,308 | Tiley | Feb. 5, 1952 |
| 2,608,668 | Hines | Aug. 26, 1952 |
| 2,623,193 | Bruck | Dec. 23, 1952 |
| 2,643,353 | Dewey | June 23, 1953 |
| 2,645,737 | Field | July 14, 1953 |
| 2,652,513 | Hollenberg | Sept. 15, 1953 |
| 2,725,499 | Field | Nov. 29, 1955 |